(12) United States Patent
Cok

(10) Patent No.: US 7,294,372 B2
(45) Date of Patent: Nov. 13, 2007

(54) CONDUCTIVE COLOR FILTERS

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 129 days.

(21) Appl. No.: 10/676,656

(22) Filed: Oct. 1, 2003

(65) Prior Publication Data

US 2005/0074565 A1 Apr. 7, 2005

(51) Int. Cl.
*G02B 5/22* (2006.01)

(52) U.S. Cl. ................. 428/1.31; 428/1.1; 349/80; 349/106; 349/108; 359/502; 353/84; 430/46.3; 438/70; 427/466

(58) Field of Classification Search ............ 428/1.1, 428/1.3, 1.31; 349/80, 104, 106, 108, 110–111; 359/502; 34/472; 315/169.3; 313/310–312, 313/491; 430/46.3; 353/84; 438/70; 427/466
See application file for complete search history.

(56) References Cited

U.S. PATENT DOCUMENTS

| | | | | |
|---|---|---|---|---|
| 2,220,111 A | * | 11/1940 | Marks | 359/352 |
| 2,493,200 A | * | 1/1950 | Land | 359/250 |
| 5,583,675 A | * | 12/1996 | Yamada et al. | 349/84 |
| 5,606,462 A | * | 2/1997 | Tsuruoka et al. | 359/891 |
| 5,672,938 A | * | 9/1997 | Jones | 313/504 |
| 5,684,553 A | * | 11/1997 | Fukuchi | 349/110 |
| 5,853,877 A | | 12/1998 | Shibuta | 428/357 |
| 5,908,721 A | | 6/1999 | Emoto et al. | 430/7 |
| 6,194,119 B1 | * | 2/2001 | Wolk et al. | 430/200 |
| 6,226,890 B1 | * | 5/2001 | Boroson et al. | 34/472 |
| 6,291,126 B2 | * | 9/2001 | Wolk et al. | 430/200 |
| 6,426,590 B1 | * | 7/2002 | Chung et al. | 313/496 |
| 6,436,591 B1 | * | 8/2002 | Ohtsu et al. | 430/7 |
| 6,514,113 B1 | * | 2/2003 | Lee et al. | 445/50 |
| 6,559,592 B1 | * | 5/2003 | Lee | 313/495 |
| 6,747,405 B2 | * | 6/2004 | Hosokawa | 313/504 |
| 6,777,869 B2 | * | 8/2004 | Pavlovsky | 313/496 |
| 6,921,575 B2 | * | 7/2005 | Horiuchi et al. | 428/367 |
| 6,984,799 B2 | * | 1/2006 | Kawaguchi et al. | 200/512 |
| 7,060,241 B2 | * | 6/2006 | Glatkowski | 423/447.1 |
| 2003/0122111 A1 | * | 7/2003 | Glatkowski | 252/500 |

FOREIGN PATENT DOCUMENTS

WO  WO 02/076724 A1  10/2002

OTHER PUBLICATIONS

Jae-Yoo Kim et al; "Electrical And Optical Studies Of Organic Light Emitting Devices Using SWCNTs-Polymer Nanocomposites"; Optical Materials; vol. 21; 2002; pp. 147-151.
H. S. Woo et al; Hole Blocking In Carbon Nanotube-Polymer Composite Organic Light-Emitting Diodes Based On Poly (m-phenylene vinylene-co-2, 5-dioctoxy-p-phenylene vinylene); Applied Physics Letters; vol. 77; No. 9; Aug. 28, 2000; pp. 1393-1395.

* cited by examiner

*Primary Examiner*—Rena Dye
*Assistant Examiner*—Sow-Fun Hon
(74) *Attorney, Agent, or Firm*—Andrew J. Anderson

(57) ABSTRACT

A conductive color filter includes a layer of carbon nanotubes covered by a colored polymeric resin binder.

29 Claims, 5 Drawing Sheets

CONDUCTIVE COLOR FILTERS

FIELD OF THE INVENTION

The present invention relates to conductive color filters and more particularly to conductive color filters useful in color display devices such as organic light emitting diode (OLED) displays.

BACKGROUND OF THE INVENTION

Organic light emitting diode (OLED) display devices utilize a current passed through thin film layers of organic materials to generate light. Electrodes located on either side of the organic layers provide current to the organic layers. The color of the light depends on the specific organic material and the light is emitted in every direction. A portion of the light is emitted directly toward the front of the display device: through a substrate (for a bottom emitter device) or a protective cover (for a top emitter device). A similar portion of the light is emitted toward the back of the display device and may be either absorbed or reflected by a layer behind the organic layers. OLED display devices can use emitters of different colors (for example, red, green, and blue) to form a full color display or can use color filters, either with the different colored emitters (as trimming filters), or with a single broad spectrum light emitter (for example, white) to form a full color display. The use of a white emitter with color filters to form a full color display is well known in the display industry and is practiced for liquid crystal displays and has been suggested for use with OLED displays.

The individual light emitting elements of a flat panel display are controlled by electrodes located on either side of a light emitting layer (e.g. an OLED) or a light modulating layer (e.g. an LCD). For example, OLED devices utilize a stack of organic layers (for example, hole injection, hole transport, emissive, electron transport, and electron injection layers) that, when current is passed through the layers, emit light whose frequency depends on the composition and structure of the layers and any intervening color filters. Alternatively, liquid crystal display light modulators controlled by electrodes and color filters to provide a color display. In either case, light travels through one or more of the electrodes. Hence, there is a need for transparent electrodes for flat panel displays of these types.

Transparent electrodes are known in the prior art and typically include indium tin oxide (ITO) or thin layers of various types of metals or metal alloys. These electrodes have a limited transparency and conductivity and there is a recognized need for transparent conductors having improved transparency and conductivity. One technology proposed for providing transparent conductors are carbon nanotubes arranged in a thin layer. For example, WO2002076724 A1 entitled "Coatings Containing Carbon Nanotubes" published 20021003 discloses electrically conductive films containing nanotubes. The disclosed films demonstrate excellent conductivity and transparency. Methods of preparing and using the films are disclosed.

U.S. Pat. No. 6,436,591 issued Aug. 20, 2002 to Ohtsu et al. shows a method of making a conductive color filter for an LCD display using a photoconductor and an electro deposition technique. The technique is complex and therefore expensive to implement.

There is a need therefore for an improved conductive color filter and method of making it.

SUMMARY OF THE INVENTION

The need is met by providing a conductive color filter that includes a layer of carbon nanotubes covered by a colored polymeric resin binder.

Advantages

The present invention has the advantage of providing an improved conductive color filter and manufacturing process.

It will be understood that the figures are not to scale since the individual layers are too thin and the thickness differences of various layers too great to permit depiction to scale.

DETAILED DESCRIPTION OF THE INVENTION

Figure 1:
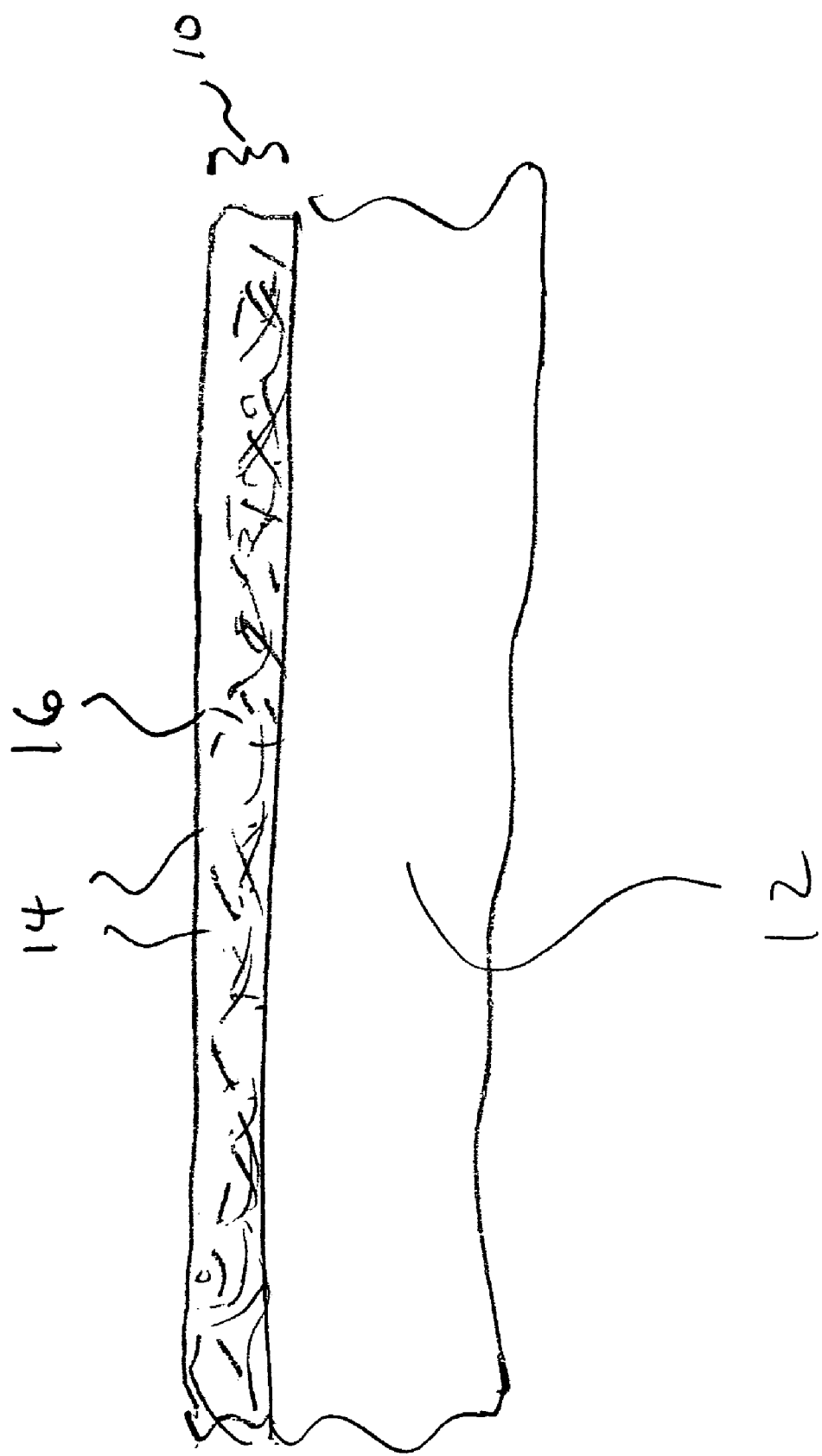
FIG. 1 is a schematic cross sectional view of a conductive color filter according to the present invention.

Referring to FIG. 1, the present invention is directed to a conductive color filter 10 formed on a substrate 12. The conductive color filter includes a layer of carbon nanotube conductors 14 covered by a colored polymeric resin binder 16 to hold the nanotube conductors 14 in place and to protect them. The polymeric resin binder may be colored using a pigment or dye to provide light absorbing or transparent color properties to the polymeric resin 16. The colors can be, for example, red, green, blue, or black. Carbon black may be used to provide a black colorant that will absorb all colors of light.

The construction of nanotubes, their deposition and the use of polymeric resins to provide structural stability are all known in the art. See, for example, WO2002076724 A1 cited above. Colored polymeric resins or polymers having dyes or pigments are also known and used to create conventional color filters, typically through photolithographic processes.

Conductive color filters may be applied in a variety of ways to improve the performance of flat panel displays. For example, referring to FIG. 2, a bottom emitter flat panel display has a substrate 12 with several conductive color filters $10_K$, $10_R$, $10_G$, and $10_B$ deposited upon it that absorb light or filters it to produce red, green, and blue respectively. The conductive color filters $10_R$, $10_G$, and $10_B$ are individually addressable to form pixels. The black conductive color filter $10_K$ absorbs ambient light to improve the contrast of the display, while conducting electricity to circuitry 26 located above the black conductive color filter $10_K$ (for example conductors, transistors, and capacitors) that do not emit light. The black conductive color filter $10_K$ absorbs ambient light, thereby improving the contrast of the display and forming a black matrix. Emissive materials 18, for example, white light emitting OLED materials comprising a plurality of layers such as hole and/or electron injection layers and hole and/or electron transport layers, are deposited above the conductive color filters $10_R$, $10_G$, and $10_B$ and may be coated in a single layer over the entire display area of the device.

The conductive color filters $10_R$, $10_G$, and $10_B$ provide power to the emissive materials 18. Another electrode 20 provides a second connection to conduct current from the conductive color filters $10_R$, $10_G$ and $10_B$ through the emissive materials 18. The electrode 20 may be reflective so that any light emitted from the emissive materials 18 toward the electrode may be reflected back through the substrate, as is conventionally done for bottom emitting emissive flat panel displays. The electrode 20 may also be colored to complement the conductive color filters $10_R$, $10_G$, and $10_B$ and is electrically connected in common with all of the light emissive elements making up the display. Note that the use of a black conductive color filter $10_K$ may be independent of the conductive color filters $10_R$, $10_G$, and $10_B$.

Figure 2:
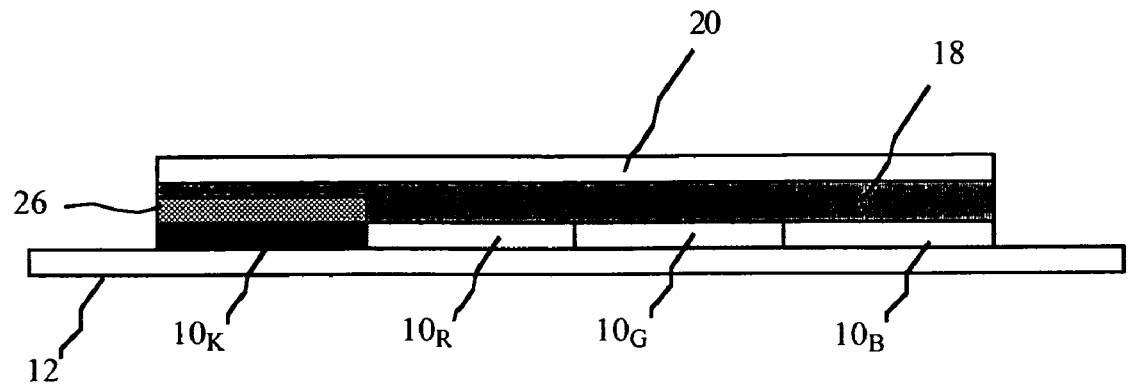
FIG. 2 is a schematic cross sectional view of a bottom emitting OLED display according to one embodiment of the present invention.
Figure 3:
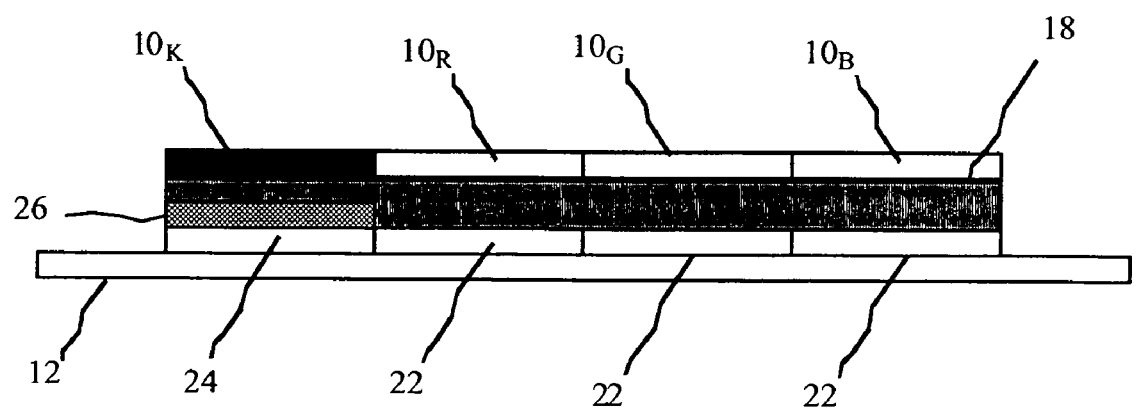
FIG. 3 is a schematic cross sectional view of a top emitting OLED display according to an alternative embodiment of the present invention.

Referring to FIG. 3, a top emitting embodiment of the present invention has a substrate 12 with several conventional electrodes 22 deposited upon it and located adjacent to the circuitry 26. The conventional electrodes 22 provide power to the light emissive layer 18 and are individually addressable to form pixels. These conventional electrodes 22 may be reflective and colored to complement the conductive color filters $10_R$, $10_G$, and $10_B$. Electrode 24 provides power to the circuitry 26. These electrodes and circuitry are conventional and known in the prior art. The light emissive layer may be coated in a single layer over the entire device. Above the light emissive layer 18 are located conductive color filters $10_K$, $10_R$, $10_G$, and $10_B$. The conductive color filters $10_K$, $10_R$, $10_G$, and $10_B$ may be electrically connected in common (as was electrode 20 in FIG. 2) but have individually colored elements, e.g. red, green, and blue, associated with the electrodes 22. Note that the conductive nanotubes may be deposited in a single coating over the surface of the display while differently colored polymeric resins are deposited in either one or multiple steps, for example with an inkjet device. The layer of polymeric resins can also function as a protective layer in a top emitting OLED device.

Figure 4:
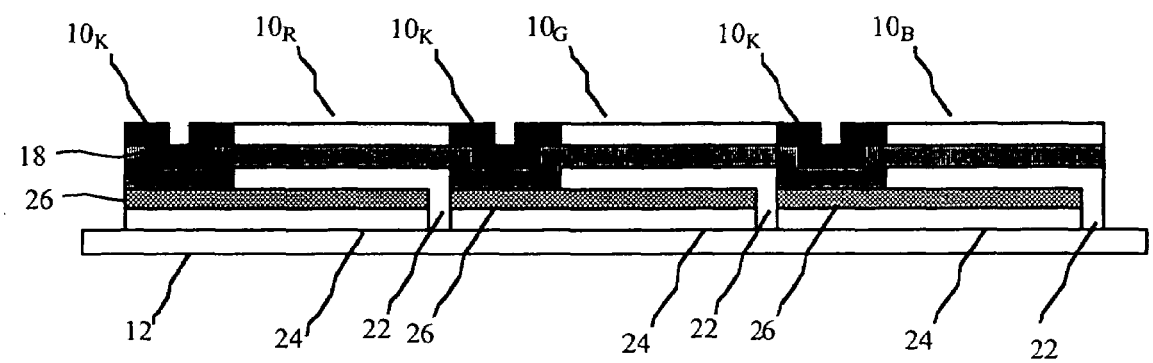
FIG. 4 is a more detailed schematic cross sectional view of the top emitting OLED display as shown in FIG. 3.

This top emitting arrangement is shown in more detail in FIG. 4. Referring to FIG. 4, the electrodes 22 pass through vias in electrode 24 and circuitry 26 and are coated over the circuitry 26 to provide a greater emissive area in the same surface area. The emissive materials 18 are coated in layers over the entire display area of the device, including the circuitry 26. The black conductive color filter $10_K$ and color filters $10_R$, $10_G$, and $10_B$ are deposited as described above to form the second electrode.

Figure 5:
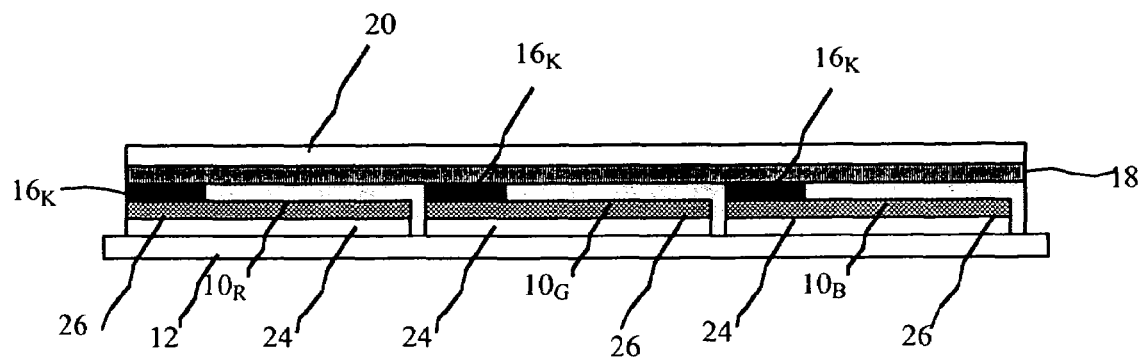
FIG. 5 is a schematic cross sectional view of a top emitting OLED display according to an alternative embodiment of the present invention.

Referring to FIG. 5, a top emitting embodiment of the present invention using the conductive color filter arrangement of FIG. 2 has conductive color filters $10_R$, $10_G$, and $10_B$ located over the circuitry 26 and has black filter $16_K$ located between them to provide additional contrast. These layers are deposited prior to the emissive materials 18 and after the construction and patterning of any circuitry 26.

Figure 6:
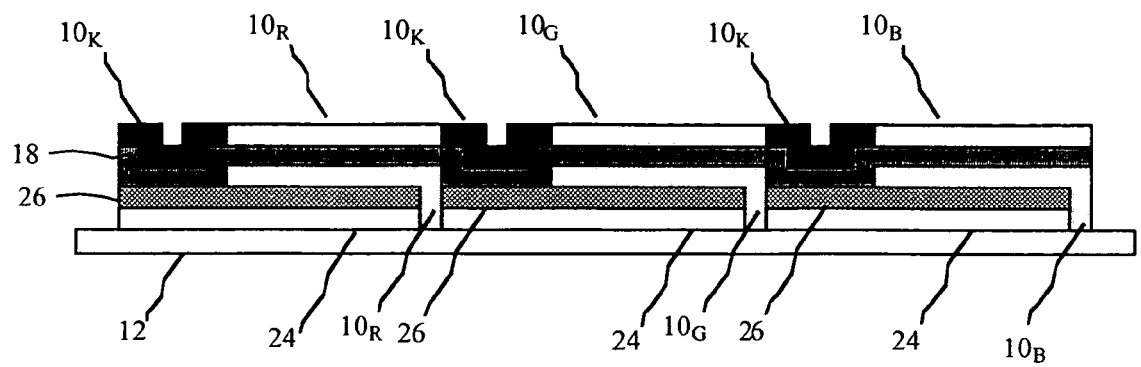
FIG. 6 is a schematic cross sectional view of a top emitting OLED display having multiple conductive color filters according to an alternative embodiment of the present invention.
Figure 7:
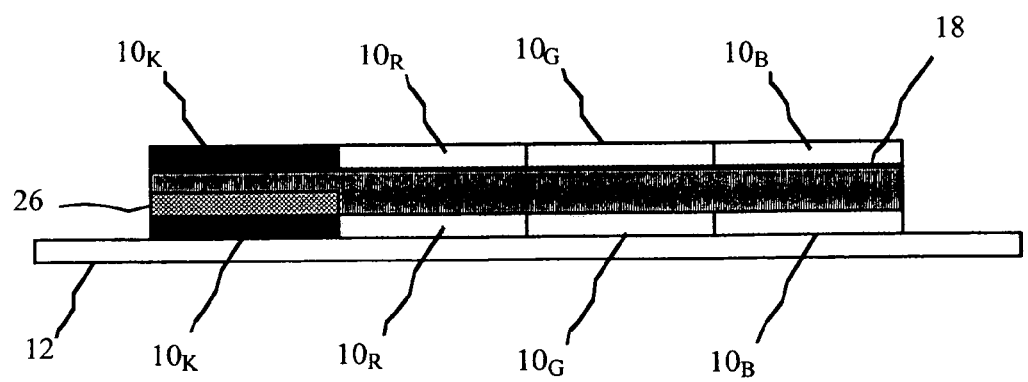
FIG. 7 is a schematic cross sectional view of a bottom emitting OLED display having multiple conductive color filters according to an alternative embodiment of the present invention.

Note that the arrangements of conductive color filters 10 shown in FIGS. 2-5 are not mutually exclusive. For example, conductive color filters 10 having a common color can be located on both sides of the emissive materials 18. An additional, reflective layer may be added to the conductive color filters e.g. 22 or 20 in the direction opposite the desired direction of emission to redirect light in a desired direction. Thus, any light that is emitted away from the desired direction of emission may pass through a conductive color filter, be reflected, pass through the conductive color filter a second time, pass through the emissive material 18, and then pass through the other conductive color filter and be emitted from the display. Passing through multiple filters can improve the color purity of the light emitted. FIG. 6 illustrates this embodiment for a top emitting display, and FIG. 7 illustrates this embodiment for a bottom emitting display.

The additional reflective layer may also be conductive and may enhance the overall conductivity of the conductive color filter 10. In addition, a transparent, conductive electrode may be deposited upon or beneath the conductive color filter 10 to enhance the overall conductivity of the conductive color filter 10. The additional reflective or transparent conductive electrode may also serve to protect underlying layers or provide improved materials compatibility between the layers.

The conductive color filters 10 are typically deposited in two steps. The first step is the coating of a dispersion of carbon nanotubes 14 in a carrier fluid. The carrier fluid is dried after which a colored polymeric resin binder 16 is applied in a thin layer over the carbon nanotubes. The polymeric resin material can comprise a wide variety of natural or synthetic polymeric resins, including but not limited to thermoplastics, thermosetting polymers, elastomers, and combinations thereof. Additional examples include polycarbonate and polyethylene teraphthalate. The polymeric resins can include a wide variety of additives in addition to the colorants such as pigments or dyes described above to provide a variety of benefits. For example, desiccant material can be used to provide resistance to humidity and ultra violet light absorbers can be added to protect the underlying materials from UV exposure.

The colored polymeric resin binder 16 can be deposited at a variety of thicknesses. In one embodiment, the polymeric resin binder is deposited in a very thin layer so that the conductive color filter 10 is conductive through the thickness of the film. This structure is necessary for the embodiment shown in FIG. 5. To achieve this conductivity, it may be necessary to repeat the film deposition process of depositing carbon nanotubes and polymeric binder successively until the conductive color filter 10 has achieved the necessary thickness to provide the desired light filtering capability and electrical conductivity.

Alternatively, it may be desirable for the conductive color filter 10 to conduct from only one side of the film, for example in the embodiment shown in FIG. 4. In this arrangement, an initial layer or layers of conductive nanotubes 14, with or without impregnating polymeric resin 16 may be deposited followed by a thicker layer of polymeric resin binder. The thicker layer of polymeric resin binder may be deposited in one step or in multiple, repeated steps. The thickness of the polymeric resin binder layer may be such that the conductive nanotubes are completely covered. In this way, very thick color filters can be created in fewer steps, but the resulting color filters are conductive only from one side of the layer.

It is also possible to first deposit a thick polymeric resin layer and then coat successive layer(s) of conductive nanotubes 14 so that the conductive color filter 10 is conductive on the side of the film having the final deposition layers rather than the first deposition layers. In this case, the initial coating(s) of polymeric resin acts as an insulator on which the conductive color filter is deposited. The initial coating may include the color filtering agents and any other desired additives.

The deposition of polymeric resin binder 16 as part of the process for forming the conductive color filters 10 can also serve to provide a black matrix for the display device. In this case, the conductive nanotubes are deposited only in the areas where an electrode is desired. However, the polymeric resin is deposited more broadly over the surface of the device. Where the conductive nanotubes are located, a conductive color filter will be formed. Where no conductive nanotubes are located, a non-conductive color filter will be formed. In this way, components of the conductive color filter and a non-conductive color filter may be formed in common processing steps. For example, the embodiment shown in FIG. 5 requires that the element $16_K$ be non-conductive and light absorbing. In FIGS. 3 and 4 it may not be required but may be preferred that the elements $10_K$ be conductive to improve the overall conductivity of the common electrode 20. In FIGS. 3 and 4 it is only necessary that the conductive color filter be conductive on the side contacting the emissive materials 18. In FIG. 2, portions of the conductive color filter $10_K$ contacting the circuitry 26 may be conductive (as shown). Alternatively, portions of the conductive color filter $10_K$ may not be conductive and will only comprise insulative resin.

As applied to top emitting OLED flat panel displays, the present invention provides an efficient and low cost means for creating a conductive color filter array by depositing an unpatterned layer of carbon nanotubes over a white light emissive layer on the display. Patterned colored polymeric resin binders can then be efficiently deposited over the carbon nanotubes using an ink jet device to form an array of electrically connected conductive color filters.

The present invention can be applied to both flat panel displays having emissive materials located between electrodes as shown in FIGS. 2-7 and liquid crystal displays, such as a backlit or reflective LCDs.

Figure 8:
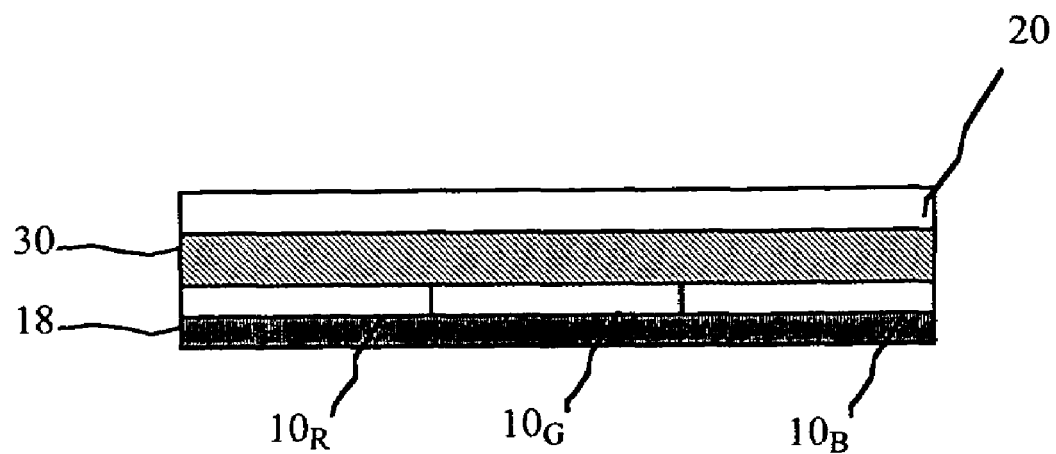
FIG. 8 is a schematic cross sectional view of a transmissive LCD display according to an alternative embodiment of the present invention.

FIG. 8 illustrates a backlit embodiment of the present invention with an emissive source 18 emitting light through conductive color filters $10_R$, $10_G$, and $10_B$ then through a liquid crystal layer 30 and then through a second electrode 20. Conductive color filters may be used in the place of electrode 20 and black conductive color filters or black filters may be used in conjunction with circuitry 26 (not shown) as described above.

Figure 9:
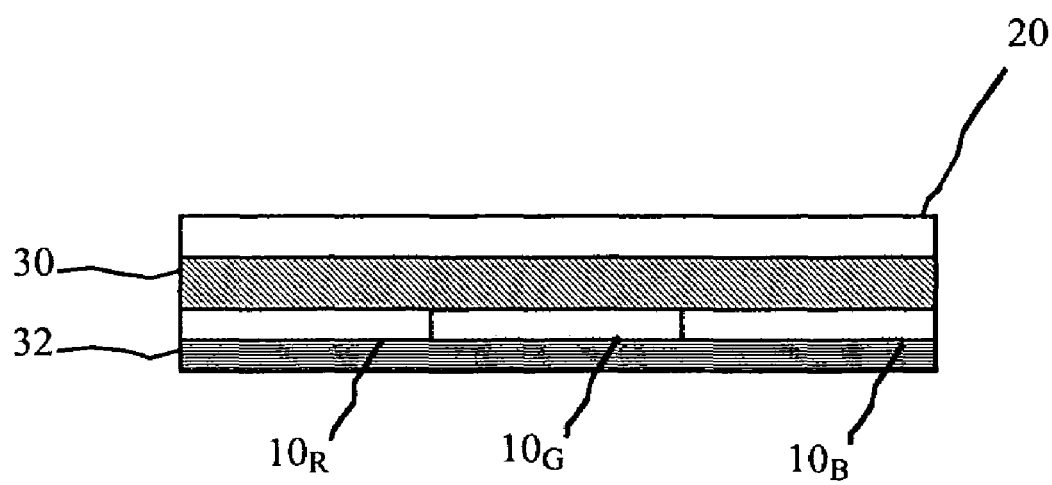
FIG. 9 is a schematic cross sectional view of a reflective LCD display according to an alternative embodiment of the present invention.

Referring to FIG. 9, a reflective embodiment of the present invention uses a similar arrangement of conductive color filters, with the addition of a reflective layer 32 at the back of the device. In this arrangement, light passes first through the electrode 20 (or conductive color filters, not shown), then through the liquid crystal layer 30, through the second conductive color filters, is reflected from the reflective layer 32, passes through the conductive color filters, liquid crystal layer 30, and electrode 20 again. (In FIGS. 8 and 9 additional polarizers, diffusers and other layers necessary to a construct a complete liquid crystal display are not shown.)

The present invention can be employed in most OLED device configurations that employ a white light emitting element in each pixel. These include simple structures comprising a separate anode and cathode per OLED and more complex structures, such as passive matrix displays having orthogonal arrays of anodes and cathodes to form pixels, and active matrix displays where each pixel is controlled independently, for example, with a thin film transistor (TFT). As is well known in the art, OLED devices and light emitting layers include multiple organic layers, including hole and electron transporting and injecting layers, and emissive layers. Such configurations are included within this invention.

The invention has been described in detail with particular reference to certain preferred embodiments thereof, but it will be understood that variations and modifications can be effected within the spirit and scope of the invention.

Parts List 10 conductive color filter
$10_K$, $10_R$, $10_G$, $10_B$ differently colored conductive color filter
12 substrate
14 nanotube conductors
16 polymeric resin binder
$16_K$ black color filter
18 emissive materials
20 electrode
22 electrode
24 electrode
26 circuitry
30 liquid crystal layer
32 reflective layer

What is claimed is:

1. An array of electrically connected conductive color filters, wherein each conductive color filter is in electrical contact with a transparent conductive electrode, at least one conductive color filter comprising an unpatterned layer of carbon nanotubes covered by a patterned layer of colored polymeric resin binder, wherein the color of the colored polymeric binder is black, red, green or blue.

2. The at least one conductive color filter in the array of electrically connected color filters claimed in claim 1, wherein the transparent conductive electrode is a thin metal or metal alloy layer.

3. The at least one conductive color filter in the array of electrically connected color filters claimed in claim 1, wherein the conductive color filter has an electrically conductive side and an electrically insulating side.

4. The at least one conductive color filter in the array of electrically connected color filters claimed in claim 3, wherein the electrically insulating side is formed by a sufficiently thick layer of polymeric resin binder.

5. The at least one conductive color filter in the array of electrically connected color filters claimed in claim 1, wherein the transparent conductive electrode is indium tin oxide.

6. The at least one conductive color filter in the array of electrically connected color filters claimed in claim 1, wherein the transparent conductive electrode is deposited upon the conductive color filter.

7. The at least one conductive color filter in the array of electrically connected color filters claimed in claim 1, wherein the conductive color filter is deposited upon the transparent conductive electrode.

8. The at least one conductive color filter in the array of electrically connected color filters claimed in claim 1, further comprising a reflective conductor in electrical contact with the conductive color filter.

9. The at least one conductive color filter in the array of electrically connected color filters claimed in claim 1, employed in a flat-panel color display.

10. The at least one conductive color filter in the array of electrically connected color filters claimed in claim 9, wherein the color is black and the conductive color filter is located in a non-emissive area of the flat-panel color display to form a black matrix.

11. The at least one conductive color filter in the array of electrically connected color filters claimed in claim 9, wherein the color is red, green or blue and is located over a light emitting element of the display.

12. The at least one conductive color filter in the array of electrically connected color filters claimed in claim 9, wherein the flat panel color display is an OLED display and wherein the conductive color filter is formed over a substrate.

13. The at least one conductive color filter in the array of electrically connected color filters claimed in claim 12, wherein the conductive color filter is an anode.

14. The at least one conductive color filter in the array of electrically connected color filters claimed in claim 12, wherein the flat panel color display is a bottom emitting OLED display.

15. The at least one conductive color filter in the array of electrically connected color filters claimed in claim 12, wherein the conductive color filter is a cathode.

16. The at least one conductive color filter in the array of electrically connected color filters claimed in claim 12, wherein the flat panel color display is a top emitting OLED display.

17. The at least one conductive color filter in the array of electrically connected color filters claimed in claim 12, wherein the polymeric resin binder provides a protective layer for the OLED.

18. The at least one conductive color filter in the array of electrically connected color filters claimed in claim 12, further comprising an ultraviolet filter material dispersed in the polymeric resin binder.

19. The at least one conductive color filter in the array of electrically connected color filters claimed in claim 9, wherein the flat panel color display is an LCD display.

20. The at least one conductive color filter in the array of electrically connected color filters claimed in claim 1, wherein the polymeric resin binder contains carbon black.

21. The at least one conductive color filter in the array of electrically connected color filters claimed in claim 1, further comprising a desiccant dispersed in the polymeric resin binder.

22. The at least one conductive color filter in the array of electrically connected color filters claimed in claim 1, wherein the conductive color filter is a film having a thickness comprised of the layer of carbon nanotubes and the layer of colored polymeric resin binder and is conductive through the thickness of the film.

23. A method of making an array of electrically connected conductive color filters, comprising the steps of:
   a) depositing a layer of carbon nanotubes onto a surface;
   b) depositing a layer of colored polymeric resin binder over the layer of carbon nanotubes; and
   c) forming the array of electrically connected conductive color filters, wherein each conductive color filter is in electrical contact with a transparent conductive electrode, at least one conductive color filter comprising an unpatterned layer of carbon nanotubules covered by a patterned layer of colored polymeric resin binder, wherein the color of the colored polymeric binder is black, red, green or blue.

24. The method claimed in claim 23, wherein the carbon nanotubes are deposited by spraying a dispersion of carbon nanotubes in a carrier fluid onto the surface and evaporating the carrier fluid from the surface.

25. The method claimed in claim 23, wherein the colored polymeric resin binder is deposited using an inkjet device.

26. The method claimed in claim 23, further comprising repeating the steps of depositing carbon nanotubes and binder in succession to increase the thickness and conductivity of the conductive color filter.

27. A method of making a flat panel display, comprising the steps of:
   a) providing a substrate having conductive elements and/or circuitry on a first portion and light emitters on a second portion of the substrate;
   b) depositing a dispersion of nanotubes in a carrier on the substrate and drying the carrier;
   c) depositing a layer of transparent colored polymeric resin binder over the nanotubes on the second portion of the substrate;
   d) depositing a black light absorbing polymeric resin binder over the nanotubes on the first portion of the substrate; and
   e) forming an array of electrically connected conductive color filters, wherein each conductive color filter is in electrical contact with a transparent conductive electrode, at least one conductive color filter comprising an unpatterned layer of carbon nanotubules covered by a patterned layer of colored polymeric resin binder, wherein the color of the colored polymeric binder is black, red, green or blue.

28. The method claimed in claim 27, wherein the display is a color display, and wherein the step of depositing a transparent colored polymeric resin binder over the nanotubes on the second portion of the substrate comprises the steps of depositing different colors of binder over different light emitters to form color pixels.

29. The method claimed in claim 28, wherein the step of depositing the transparent colored polymeric resin binder is performed with an ink jet device.

* * * * *